(12) United States Patent
Feng et al.

(10) Patent No.: US 12,713,701 B2
(45) Date of Patent: Aug. 18, 2026

(54) ARRAY SUBSTRATE AND DISPLAY PANEL INCLUDING THE SAME

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 329 days.

(21) Appl. No.: 18/549,038

(22) PCT Filed: Oct. 31, 2022

(86) PCT No.: PCT/CN2022/128569
§ 371 (c)(1),
(2) Date: Sep. 5, 2023

(87) PCT Pub. No.: WO2024/092392
PCT Pub. Date: May 10, 2024

(65) Prior Publication Data

US 2025/0022887 A1 Jan. 16, 2025

(51) Int. Cl.
*H10D 86/60* (2025.01)
*H10D 86/40* (2025.01)

(52) U.S. Cl.
CPC .......... *H10D 86/60* (2025.01); *H10D 86/441* (2025.01)

(58) Field of Classification Search
CPC ..... H10D 86/60; H10D 86/441; G02F 1/1362
See application file for complete search history.

(56) References Cited

U.S. PATENT DOCUMENTS

2011/0013106 A1 1/2011 Liu
2013/0264575 A1* 10/2013 Liu .................. G02F 1/136286 257/59

(Continued)

FOREIGN PATENT DOCUMENTS

CN 101957530 A 1/2011
CN 103035192 A 4/2013
CN 104124279 A 10/2014

(Continued)

*Primary Examiner* — Eliseo Ramos Feliciano
*Assistant Examiner* — Sophia W Kao
(74) *Attorney, Agent, or Firm* — Myers Bigel, P.A.

(57) ABSTRACT

The present disclosure relates to an array substrate and a display panel, the array substrate including at least one pixel unit and a first gate line, each pixel unit including at least one sub-pixel, each sub-pixel including a pixel circuit, the pixel circuit including a first transistor, the first gate line being electrically connected to a gate of the first transistor through a first connecting part, the first connecting part and the first gate line being located in different conductive layers from each other. The array substrate provided in some embodiments of the present disclosure eliminates the risk of pixel circuit transistor damage caused by electrostatic conduction of the gate line by means of the measure of same layer separation and cross layer connection of the gate of the transistor and the corresponding gate line.

11 Claims, 4 Drawing Sheets

(56) References Cited

U.S. PATENT DOCUMENTS

| | | | | |
|---|---|---|---|---|
| 2020/0411619 | A1* | 12/2020 | Huang ................. | H10K 59/124 |
| 2024/0178240 | A1* | 5/2024 | Ma ....................... | H10D 86/021 |

FOREIGN PATENT DOCUMENTS

| | | | | |
|---|---|---|---|---|
| CN | 111427207 | A | | 7/2020 |
| CN | 211788997 | U | * | 10/2020 |
| CN | 215813671 | U | | 2/2022 |
| CN | 114937701 | A | | 8/2022 |
| CN | 217562568 | U | | 10/2022 |
| KR | 20000043548 | A | | 7/2000 |

* cited by examiner

ARRAY SUBSTRATE AND DISPLAY PANEL INCLUDING THE SAME

RELATED APPLICATIONS

The present application is a 35 U.S.C. 371 national stage application of PCT International Application No. PCT/CN2022/128569, filed on Oct. 31, 2022.

TECHNICAL FIELD

The present disclosure relates to the field of display technologies, and more particularly, to an array substrate and a display panel.

BACKGROUND

In display panels (especially oversized panels) or array substrates of related technologies, electrostatic charges generated during the dry etching process of the gate insulation layer after the formation of the transistor gate layer in the pixel circuit accumulates on the gate line, posing a risk of breakdown between the gate and channel of the transistor, thereby damaging the pixel circuit, causing pixel failure, and reducing panel yield.

SUMMARY

In view of this, the present disclosure provides an array substrate and a display panel comprising the array substrate, which can release, mitigate, or even eliminate the aforementioned problems.

According to an aspect of the present disclosure, an array substrate is provided, comprising: at least one pixel unit, each pixel unit comprising at least one sub-pixel, each sub-pixel comprising a pixel circuit, the pixel circuit comprising a first transistor; and a first gate line electrically connected to a gate of the first transistor through a first connecting part, the first connecting part and the first gate line being located in different conductive layers from each other.

In the array substrate according to some embodiments of the present disclosure, at least a portion of the first connecting part is arranged in a same layer as source-drain of the first transistor.

In the array substrate according to some embodiments of the present disclosure, the first connecting part is electrically connected to the gate of the first transistor and the first gate line through a first via and a second via respectively, the first via and the second via are arranged on an interlayer dielectric layer, and the interlayer dielectric layer is located between a source-drain layer and a gate layer of the array substrate.

In the array substrate according to some embodiments of the present disclosure, the array substrate comprises a buffer layer and a light shielding layer, the buffer layer is located above a base substrate of the array substrate and the light shielding layer is located between the buffer layer and the base substrate, the light shielding layer comprises a light shielding pattern made of a conductive material, and the light shielding pattern is electrically connected to the source-drain of the first transistor through a third via, wherein the third via comprises a first sub-via arranged on the interlayer dielectric layer and a second sub-via arranged on the buffer layer.

In the array substrate according to some embodiments of the present disclosure, the first connecting part comprises: a first connecting sub-part and a second connecting sub-part arranged in a same layer as the source-drain of the first transistor, and a third connecting sub-part arranged in a same layer as the light shielding layer, and wherein the first connecting sub-part is electrically connected to the gate of the first transistor through a fourth via, the second connecting sub-part is electrically connected to the first gate line through a fifth via, and the third connecting sub-part is electrically connected to the first connecting sub-part and the second connecting sub-part respectively through a sixth via, wherein the fourth via and the fifth via are arranged on the interlayer dielectric layer, and the sixth via is arranged on the interlayer dielectric layer and the buffer layer.

In the array substrate according to some embodiments of the present disclosure, the sixth via comprises a first sub-via arranged on the interlayer dielectric layer and a second sub-via arranged on the buffer layer, orthogonal projections of the first sub-via and the second sub-via on the base substrate of the array substrate at least partially overlap with each other.

In the array substrate according to some embodiments of the present disclosure, the sixth via and the third via are the same via.

In the array substrate according to some embodiments of the present disclosure, the pixel circuit further comprises a second transistor, and the array substrate further comprises: a second gate line electrically connected to a gate of the second transistor, the second gate line comprising a first sub gate line and a second sub gate line separated from each other, the first sub gate line and the second sub gate line are electrically connected to each other through the second connecting part, the second connecting part and the second gate line are located in different conductive layers from each other.

In the array substrate according to some embodiments of the present disclosure, at least a portion of the second connecting part is arranged in a same layer as source-drain of the second transistor.

In the array substrate according to some embodiments of the present disclosure, the second connecting part is electrically connected to the first sub gate line and the second sub gate line through a seventh via and an eighth via respectively, the seventh via and the eighth via are arranged on the interlayer dielectric layer.

In the array substrate according to some embodiments of the present disclosure, the second connecting part comprises: a fourth connecting sub-part and a fifth connecting sub-part arranged in the same layer as the source-drain of the second transistor, as well as a sixth connecting sub-part arranged in the same layer as the light shielding layer, and wherein the fourth connecting sub-part is electrically connected to the first sub gate line through a ninth via, the fifth connecting sub-part is electrically connected to the second sub gate line through a tenth via, the sixth connecting sub-part is electrically connected to the fourth connecting sub-part and the fifth connecting sub-part respectively through an eleventh via, the ninth via and the tenth via are arranged on the interlayer dielectric layer, the eleventh via is arranged on the interlayer dielectric layer and the buffer layer.

In the array substrate according to some embodiments of the present disclosure, the eleventh via comprises a third sub-via arranged on the interlayer dielectric layer and a fourth sub-via arranged on the buffer layer, orthogonal projections of the third sub-via and the fourth sub-via on the base substrate of the array substrate at least partially overlap with each other.

In the array substrate according to some embodiments of the present disclosure, the first sub gate line and the second sub gate line are separated from each other between two adjacent sub-pixels in the pixel unit.

In the array substrate according to some embodiments of the present disclosure, the pixel circuit comprises a 3T1C pixel circuit, wherein at least one of the first transistor and the second transistor is a switch transistor.

In the array substrate according to some embodiments of the present disclosure, at least one of the first transistor and the second transistor is a thin film transistor.

According to another aspect of the present disclosure, a display panel is provided, comprising an array substrate according to some embodiments.

According to the embodiments described below, these and other aspects of the present disclosure will be clearly understood and will be clarified with reference to the embodiments described below.

BRIEF DESCRIPTION OF THE DRAWINGS

In the following description of exemplary embodiments in conjunction with the accompanying drawings, further details, features, and advantages of the present disclosure will be disclosed, in the drawings.

It should be understood that the accompanying drawings are only illustrative and not necessarily drawn to scale, and may emphasize the essential features for explaining the embodiments of the present disclosure, while omitting some other features.

DETAILED DESCRIPTION OF THE DISCLOSURE

It should be understood that although the term herein such as "first", "second" and so on can be used to describe various devices, features, or parts, these devices, features, or parts should not be limited by these terms. These terms are only used to distinguish one device, feature, or part (or a group of devices, features, or parts) from another device, feature, or part (or another group of devices, features, or parts). It should also be understood that "a plurality" referred in the disclosure can mean two or more without other restrictions. It should also be understood that the words "connected", "coupled" or the like mentioned in the disclosure may refer to a situation of direct connecting and direct coupling, and may also refer to a situation of indirect connecting and indirect coupling realized via one or more intermediate device, component, etc. In some embodiments, "connecting" and "coupling", "engaging", "interconnecting" or similar words can refer to fixed connection or detachable connection. For example, in the description that one element or device is connected to another element or device, it may mean that one element or device is fixedly connected to another element or device, or that one element or device is detachably connected to another element or device. In some embodiments of the present disclosure, "being arranged in the same layer" can represent using the same film-forming process to form a film layer with a specific pattern, and then using the same mask to form a layer structure through a single composition process, wherein the specific pattern can be continuous or discontinuous, and can also have different heights or thicknesses.

The present invention eliminates the risk of breakdown of pixel circuit transistors (such as TFTs) in the gate lines of the array substrate caused by static electricity through an isolated (i.e., same layer separation, non-same layer or cross layer bridging) method. Specifically, the wires between the gate of transistors in pixel circuits (such as switch transistors T2 and T3 in 3T1C) and gate line can be separated at the gate layer and connected or bridged through the connecting part arranged at the source-drain layer (SD) and/or light shielding layer (SHL), thereby achieving that static electricity from long gate lines cannot be transmitted to the intersection of the channel and the gate of transistors, thereby avoiding damage to the pixel circuit and improving product yield.

Figure 1:
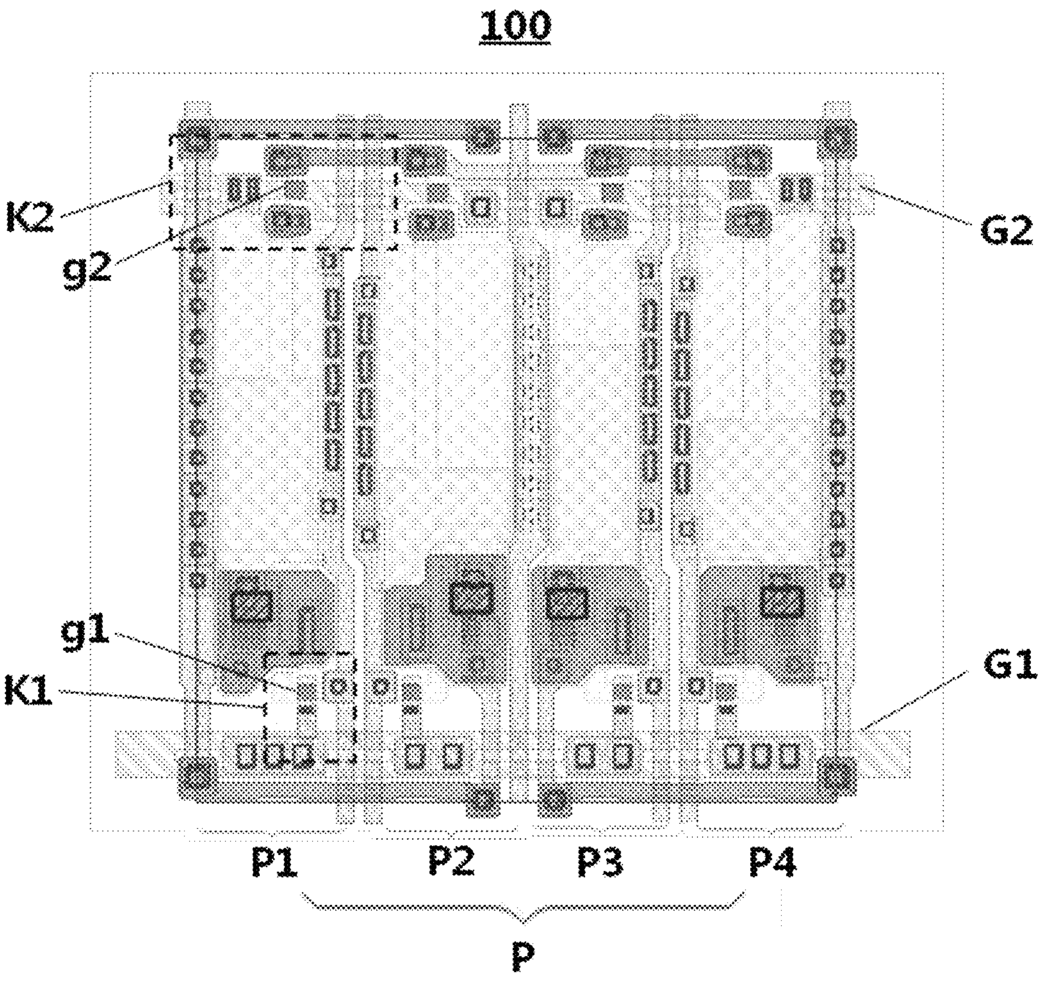
FIG. 1 shows a structural schematic diagram of an array substrate according to some embodiments of the present disclosure.

FIG. 1 shows a structural schematic diagram of an array substrate 100 according to some embodiments of the present disclosure.

Exemplarily, as shown in FIG. 1, the array substrate 100 comprises: a pixel unit P, a first gate line G1, and a second gate line G2. The pixel unit P comprises sub-pixels P1, P2, P3, and P4 (such as RGBW), each sub-pixel comprising a light emitting element and a pixel circuit electrically connected to the light emitting element. Each pixel circuit comprises at least one transistor. For illustration purposes, the array substrate 100 shown in FIG. 1 only includes one pixel unit P, but it can be understood that the array substrate can comprise a plurality of pixel units arranged in an array. Although FIG. 1 shows that the pixel unit P comprises four sub-pixels P1, P2, P3, and P4, the pixel unit P may also comprise three sub-pixels corresponding to the three primary colors (such as RGB). Except for the case of two gate lines, the array substrate 100 shown in FIG. 1 can comprise one gate line or three or more gate lines.

As shown in the dashed box K1 of FIG. 1, the pixel circuit in the sub-pixel P1 comprises a first transistor (such as a thin film transistor TFT or other transistor) with a gate g1, which is electrically connected to the first gate line G1 to obtain therefrom a gate signal sent by a gate driving circuit. The dashed box K1 shows across-layer connection between the first gate line G1 and the gate g1 (i.e., both of them are not directly connected with each other in the same layer, but are mutually bridged or connected indirectly through other conductive layers). For details, please refer to the enlarged view of K1 shown in FIG. 2.

Figure 2:
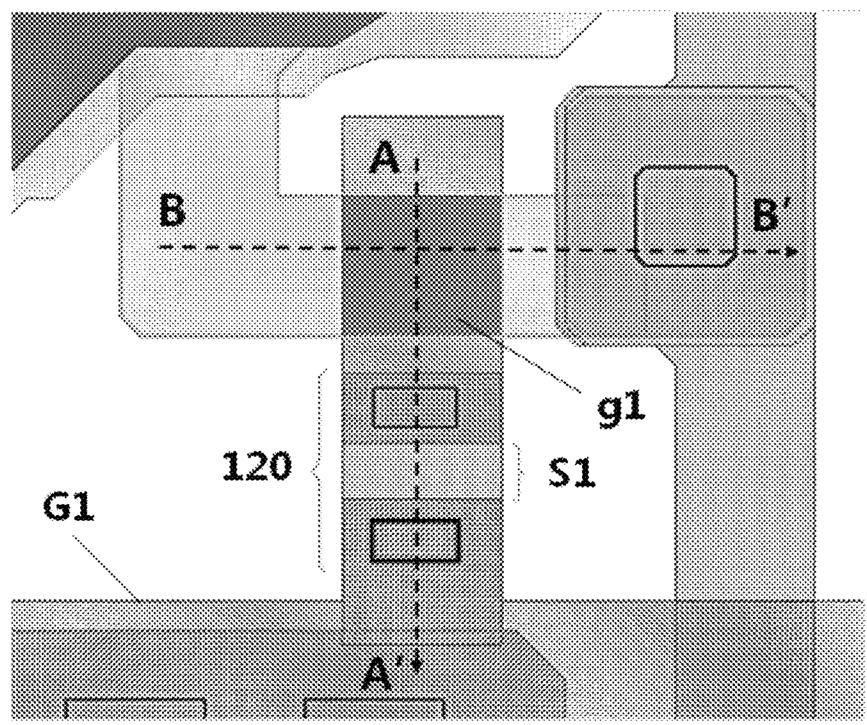
FIG. 2 shows a partial enlarged view of an array substrate according to some embodiments of the present disclosure.

FIG. 2 shows an enlarged view of the portion shown in the dashed box K1 of FIG. 1. As shown in FIG. 2, in order to prevent static electricity generated on the first gate line G1 from being transmitted to the gate g1, for example, the first gate line G1 is not directly connected to the first transistor gate g1 in the same layer (i.e. gate layer), where there is a gap S1. Furthermore, as shown in FIG. 2, in order to achieve normal transmission of gate signals when the first gate line G1 is separated from the gate g1 in the same layer, a first connecting part 120 is arranged in other layers (such as other conductive layers above or below the gate layer) different from the gate layer, and is connected across layer to the first gate line G1 and the gate g1 through two vias.

Figure 3A:
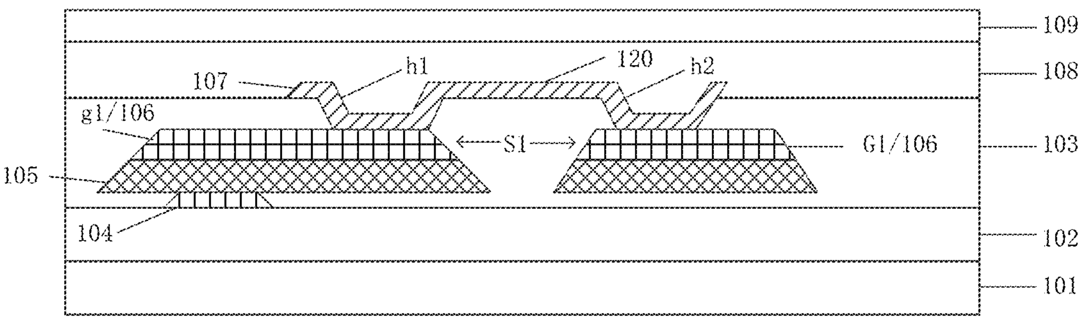
FIG. 3A shows a first cross-sectional schematic diagram of the array substrate according to some embodiments of the present disclosure along the dashed line AA' shown in FIG. 2.

FIG. 3A shows a first cross-sectional schematic diagram of the array substrate according to some embodiments of the present disclosure along the dashed line AA' shown in FIG. 2. As shown in FIG. 3A, in some embodiments, the array substrate 100 can comprise a base substrate 101, a buffer layer (Buffer) 102, an interlayer dielectric layer (ILD) 103, an active layer (ACT) 104, a gate insulation layer (GI) 105, a gate layer (GT) 106, a source-drain layer (SD) 107, a passivation layer (PVX) 108 and a planarization layer (RES) 109 along the thickness direction (from the bottom up), wherein the interlayer dielectric layer 103 is located between the buffer layer 102 and the passivation layer 108 and separates the gate layer 106 from the source-drain layer 107. In the array substrate 100, the gate layer 106 and the source-drain layer 107 are conductive layers, and thus they can be made of conductive materials, such as various metal materials. The active layer 104 can use semiconductor materials, such as metal oxides, polycrystalline silicon, amorphous silicon, etc. The buffer layer 102, the interlayer dielectric layer 103, the gate insulation layer 105 and the passivation layer 108 are all insulation layers, so various insulation materials can be used, such as inorganic insulation materials. The planarization layer 109 can use organic materials, such as polyene materials and polyester materials, etc.

As shown in FIG. 3A, in order to prevent, for example, the static electricity generated by the first gate line G1 (especially the long gate line) during the process of dry etching the gate insulation layer 105 from being transmitted to the gate g1 to avoid the risk of transistor breakdown, the gate g1 of the first transistor and the first gate line G1 are separated from each other in the gate layer 106, i.e., both of them are not directly electrically connected to each other in the same layer, but there is a gap S1 between them. As shown in FIG. 3A, in order to enable the gate g1 of the first transistor to obtain the gate signal from the first gate line G1 to achieve its normal function, a first connecting part 120 can be arranged in the source-drain layer 107 for cross layer (i.e. crossing the interlayer dielectric layer 103) electrical connection to the gate g1 of the first transistor and first gate line G1 located in the gate layer 106, so as to achieve a connection structure of same layer separation and cross layer connection between the gate g1 and the first gate line G1. In particular, as shown in FIG. 3A, the first connecting part 120 located in the source-drain layer 107 can be electrically connected to the gate g1 of the first transistor and the first gate line G1 located in the gate layer 106 through a first via h1 and a second via h2 arranged in the interlayer dielectric layer 103 respectively.

Generally, the source-drain layer 107 of the array substrate 100 can be manufactured just after the gate insulation layer 106 is dry etched, and the first connecting part 120 can be considered as a part of the source-drain layer 107 and made together with the source-drain (and the data line that provides data signals for it), which blocks the static electricity generated by the first gate line G1 during the dry etching of the gate insulation layer 107. Because the source-drain layer 107 has not yet been formed when manufacturing the gate insulation layer (i.e. when static electricity is generated and gathered in the gate lines), there is no the first connection part 120 yet and the first gate line G1 is separated from the gate g1, i.e. there is no direct electrical connection between them, so that the propagation of static electricity is blocked and will not cause damage to the gate of the first transistor. In other words, the bridging structure shown in FIG. 3A is not only able to achieve normal transmission of the gate signal generated by the first gate line G1 to the transistor gate g1, but also able to avoid the risk of active layer channel breakdown caused by electrostatic conduction of the (long) gate line.

Figure 3B:
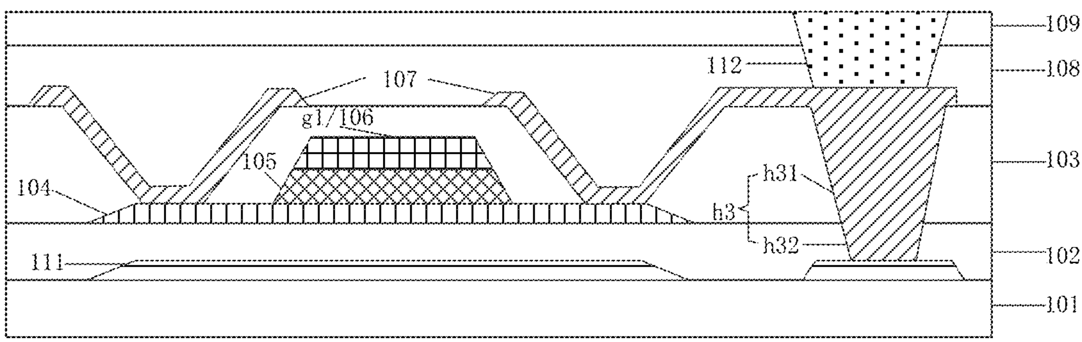
FIG. 3B shows a cross-sectional schematic diagram of the array substrate according to some embodiments of the present disclosure along the dashed line BB' shown in FIG. 2.

FIG. 3B shows a cross-sectional schematic diagram of the array substrate according to some embodiments of the present disclosure along the dashed line BB' shown in FIG. 2. As shown in FIG. 3B, in addition to the base substrate 101, the buffer layer (Buffer) 102, the interlayer dielectric layer (ILD) 103, the active layer (ACT) 104, the gate insulation layer (GI) 105, the gate layer (GT) 106, the source-drain layer (SD) 107, the passivation layer (PVX) 108, and the planarization layer (RES) 109, the array substrate 100 can also comprise a light shielding layer 111 located on a side of base substrate 101 close to the buffer layer 102, and an anode 112 of the light-emitting element electrically connected to the source-drain layer 107 through a via arranged on the planarization layer 109 and the passivation layer 108.

As shown in FIG. 3B, the orthogonal projection of at least a portion of the light shielding layer 111 on the base substrate 101 (i.e., in the thickness direction of the array substrate) can overlap with the orthogonal projection of the active layer 104, so as to prevent external light from illuminating the active layer 104 of the transistor (thus avoiding the deviation of the threshold voltage of the transistor caused by light in order to improve the stability and performance of the transistor). In some embodiments, the material of the light shielding layer 111 can use, for example, an insulating material (such as black matrix material), or can also use a conductive (such as metal) material. When the light shielding layer 111 is made of a metal material, it can be electrically connected to the source-drain layer 107 to improve the electrical performance of the transistor. As shown in FIG. 3B, the source-drain layer 107 can be electrically connected to the light shielding layer 111 through a third via h3, wherein the third via comprises a first sub-via h31 arranged on the interlayer dielectric layer 103 and a second sub-via h32 arranged on the buffer layer 102.

Figure 3C:
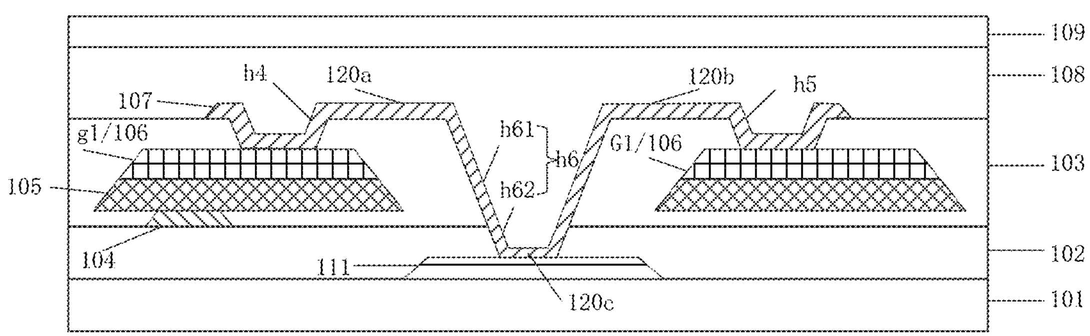
FIG. 3C shows a second cross-sectional schematic diagram of the array substrate according to some embodiments of the present disclosure along the dashed line AA' shown in FIG. 2.

FIG. 3C shows a second cross-sectional schematic diagram of the array substrate according to some embodiments of the present disclosure along the dashed line AA' shown in FIG. 2. In order to realize the connection structure of the same layer separation and cross layer connection between the gate g1 and the first gate line G1 to eliminate the risk of electrostatic breakdown, in addition to arranging the first connecting part 120 in the same layer as the source-drain layer 107 as shown in FIG. 3A, optionally, the first connecting part 120 can also be arranged in the same layer as the light shielding layer 111 as shown in FIG. 3B and the source-drain layer 107. As shown in FIG. 3C, in some embodiments, the first connecting part 120 can comprise a first connecting sub-part 120*a* and a second connecting sub-part 120*b* arranged in the same layer as the source-drain layer 107, and a third connecting sub-part 120*c* arranged in the same layer as the light shielding layer 111, wherein the first connecting sub-part 120*a* is electrically connected to the gate g1 of the first transistor through a fourth via h4, the second connecting sub-part 120*b* is electrically connected to the first gate line G1 through a fifth via h5, and the third connecting sub-part 120*c* is electrically connected to the first connecting sub-part 120*a* and the second connecting sub-part 120*b* respectively through a sixth via h6. As shown in FIG. 3C, the fourth via h4 and the fifth via h5 are both arranged on the interlayer dielectric layer 103, and the sixth via h6 comprises a first sub-via h61 arranged on the interlayer dielectric layer 103 and a second sub-via h62 arranged on the buffer layer 102. As shown in the figure, optionally, orthogonal projections of the first sub-via h61 and the second sub-via h62 on the base substrate 101 of the array substrate 100 at least partially overlap with each other or can completely overlap with each other, so that the overlapping part of the first sub-via h61 and the second sub-via h62 can be manufactured together (such as etching at the same time), thus simplifying the manufacturing process. In addition, the more overlap, the more favorable it is for the wire to pass through the via h6 and reduce the length of the wire required in the via h6.

In some embodiments, when the light shielding layer 111 is made of metal material, as shown in FIG. 3B, the source-drain layer 107 can be electrically connected to the light shielding layer 111 through a third via h3. Therefore, when preparing the source-drain layer 107 and its connecting wire to the light shielding layer 111, the first connecting part 120 can be simultaneously made. In other words, the first connecting sub-part 120*a* and the second connecting sub-part 120*b*, as well as the corresponding fourth via h4 and fifth via h5, can be made on the same layer as the source-drain, and the third connecting sub-part 120*c* and the corresponding sixth via h6 are made in the same layer (light shielding layer) as the connecting wires from the source-drain layer 107 to the light shielding layer 111. Such a same-layer preparation process avoids the complex process caused by separate production of different functional structures, thereby simplifying the production process, effectively improving the working efficiency, and reducing product production costs.

Optionally, as shown in FIGS. 3B and 3C, when making the sixth via h6, the third via h3 shown in FIG. 3B can be directly used as the sixth via h6, as both of them are used for electrical connection from the source-drain layer 107 to the light shielding layer 111. In this way, the existing structure can be fully utilized to meet the new functional requirement, so as to avoid separate production of the sixth via h6 and simplify the process flow.

In some embodiments, as shown in the dashed box K2 of FIG. 1, the pixel circuit in the sub-pixel P1 comprises a second transistor with a gate g2. The gate g2 is electrically connected to a second gate line G2 to obtain therefrom a gate signal sent by a gate driving circuit. The dashed box K2 shows that at the place near the gate g2, in order to block the damage to g2 caused by static electricity possibly generated by the second gate line G2 (for example, to avoid or eliminate the risk of electrostatic breakdown of the active layer channel corresponding to g2), the second gate line G2 can also be directly separated and the two separated gate lines can be electrically connected to each other by means of a cross-layer bridging manner. For details, please refer to the enlarged view of the portion in K2 shown in FIG. 4 and the cross-sectional view shown in FIGS. 5A-5B.

Figure 4:
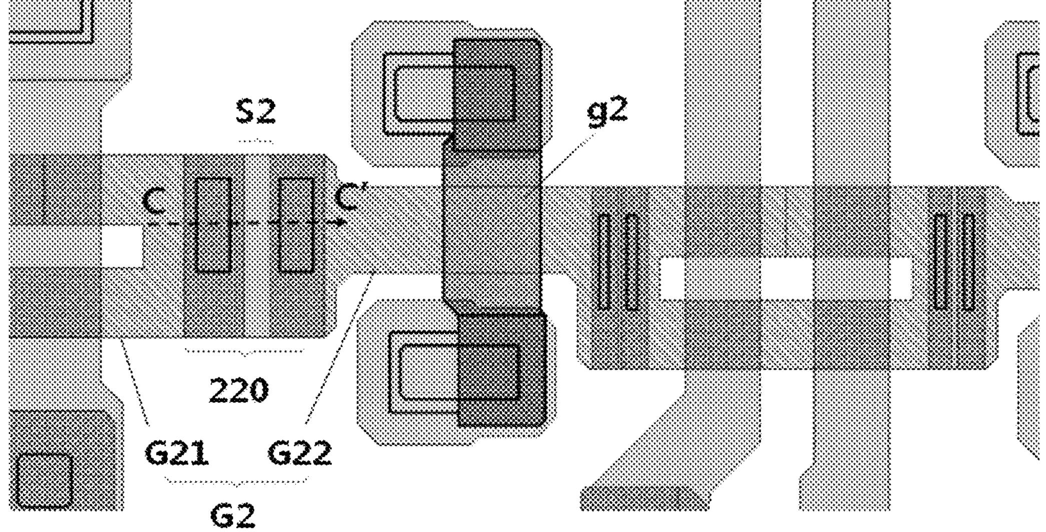
FIG. 4 shows a partial enlarged view of an array substrate according to some embodiments of the present disclosure.

FIG. 4 shows an enlarged view of the portion shown in the dashed box K2 of FIG. 1. As shown in FIG. 4, In order to prevent static electricity generated on the second gate line G2 from being transmitted to the gate g2 of the second transistor, the second gate line G2 is separated into two sub gate lines, that is, the second gate line G2 comprises a first sub gate line G21 and a second sub gate line G22 that are separated from each other, with a gap of S2 between the two sub gate lines. As shown in FIG. 4, in order to achieve normal transmission of gate signals to gate g2 when the second gate line G2 is separated, a second connecting part 220 is arranged in other layers (such as the source-drain layer above the gate layer where the second gate line G2 is located) different from the gate layer, and electrically connects the first and second sub gate lines G21 and G22, that are separated from each other, together across layer through two vias.

Figure 5A:
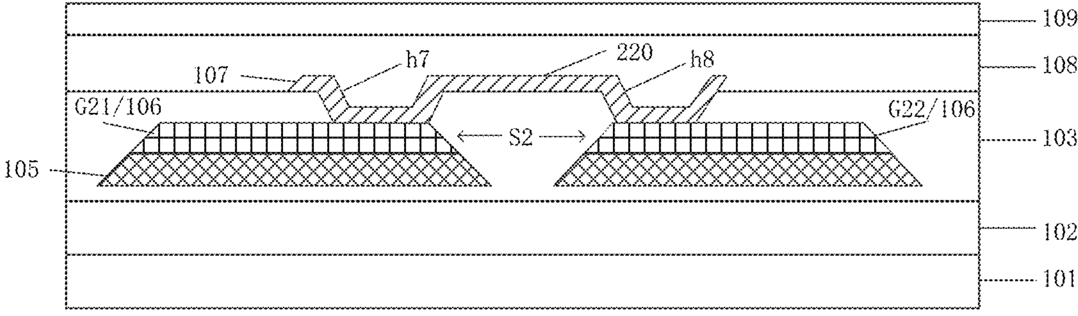
FIG. 5A shows a first cross-sectional schematic diagram of the array substrate according to some embodiments of the present disclosure along the dashed line CC' shown in FIG. 4.

FIG. 5A shows a first cross-sectional schematic diagram of the array substrate according to some embodiments of the present disclosure along the dashed line CC' shown in FIG. 4. As shown in FIG. 5A, in some embodiments, similar to FIG. 3A, the array substrate 100 can sequentially comprise a base substrate 101, a buffer layer (Buffer) 102, an interlayer dielectric layer (ILD) 103, a gate insulation layer (GI) 105, a gate layer (GT) 106, a source-drain layer (SD) 107, a passivation layer (PVX) 108, and planarization layer (RES) 109 along the thickness direction (from the bottom up). Unlike FIG. 3A, as the CC' shown in FIG. 4 does not involve the gate g2, there is no active layer corresponding to the gate g2 (for example, the projections of them on the base substrate 101 overlap) in the first cross-sectional view of FIG. 5A. It should be noted that although the reference signs used for each layer structure in FIG. 5A are the same as those in FIG. 3A, the layer structures corresponding to the same reference sign in FIG. 5A and FIG. 3A can also be different.

As shown in FIG. 5A, in order to prevent, for example, the static electricity generated by the second gate line G2 (especially the long gate line) during the process of dry etching of the gate insulation layer 105 from being transmitted to the gate g2 to avoid the risk of transistor breakdown, the second gate line G2 is separated into a first sub gate line G21 and a second sub gate line G22 in the gate layer 106, that is, the two sub gate lines are not directly electrically connected in the same layer, but there is a gap S2 between them. As shown in FIG. 5A, in order to enable the gate g2 of the second transistor to obtain the gate signal from the second gate line G2 to achieve its normal function, a second connecting part 220 can be arranged in the source-drain layer 107 for electrically connecting the first and second sub gate lines G21 and G22 located in the gate layer 106 across layer (i.e. crossing the dielectric layer 103), so as to achieve a connection structure of same layer separation and cross layer connection of the second gate line G2 near the gate g2. In particular, as shown in FIG. 5A, the second connecting part 220 located in the source-drain layer 107 can be electrically connected to the first and second sub gate lines G21 and G22 located in the gate layer 106 through a seventh via h7 and an eighth via h8 arranged in the interlayer dielectric layer 103, respectively.

Similar to the bridging structure between the gate g1 and first gate line G1 shown in FIG. 3A, the cross-layer connection structure of the second gate line G2 shown in FIGS. 4 and 5A, also in view of the characteristics of the source-drain layer 107 being made later than the gate layer 106 and the gate insulation layer 105, separates the second gate line G2 in the gate layer and then connects the separated gate lines across layers in the source-drain layer, so as to avoid or eliminate the risk of transistor channel breakdown caused by (long) gate line electrostatic conduction while ensuring the normal transmission of the gate signal generated by the second gate line G2 to the second transistor gate g2.

Figure 5B:
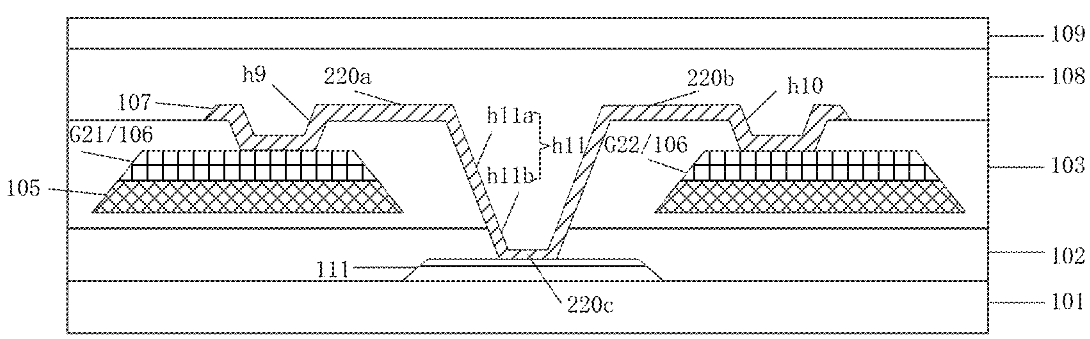
FIG. 5B shows a second cross-sectional schematic diagram of the array substrate according to some embodiments of the present disclosure along the dashed line CC' shown in FIG. 4.

FIG. 5B shows a second cross-sectional schematic diagram of the array substrate according to some embodiments of the present disclosure along the dashed line CC' shown in FIG. 4. Similar to FIG. 3C, in order to realize the connection structure of the same layer separation and cross layer connection of the second gate line G2 to eliminate the risk of electrostatic breakdown, in addition to arranging the second connecting part 220 in the same layer as the source-drain layer 107 as shown in FIG. 5A, optionally, the second connecting part 220 can also be arranged in the same layer as the light shielding layer 111 shown in FIG. 3B and the source-drain layer 107. As shown in FIG. 5B, in some embodiments, the second connecting part 220 can comprise a fourth connecting sub-part 220*a* and a fifth connecting sub-part 220*b* arranged in the same layer as the source-drain layer 107, and a sixth connecting sub-part 220*c* arranged in the same layer as the light shielding layer 111, wherein the fourth connecting sub-part 220*a* is electrically connected to the first sub gate line G21 through a ninth via h9, the fifth connecting sub-part 220*b* is electrically connected to the second sub gate line G22 through a tenth via h10, and the sixth connecting sub-part 220*c* is electrically connected to the fourth connecting sub-part 220*a* and the fifth connecting sub-part 220*b* through an eleventh via h11 respectively. As shown in FIG. 5B, the ninth via h9 and the tenth via h10 can be both arranged on the interlayer dielectric layer 103, and the eleventh via h11 can comprise a third sub-via hlla arranged on the interlayer dielectric layer 103 and a fourth sub-via h11*b* arranged on the buffer layer 102. As shown in FIG. 5B, optionally, the orthogonal projections of the third sub-via hlla and the fourth sub-via h11*b* on the base substrate 101 of the array substrate 100 at least partially overlap with each other.

In some embodiments, when preparing the source-drain layer 107 and its connecting wire to the light shielding layer 111 shown in FIG. 3B, the second connecting part 220 shown in FIG. 5B can be simultaneously made. In other words, the fourth connecting sub-part 220*a* and fifth connecting sub-part 220*b*, as well as the corresponding ninth via h9 and tenth via h10, can be made in the same layer as the source-drain layer 107, and the sixth connecting sub-part 220*c* and the corresponding eleventh via h11 are made in the same layer (light shielding layer) as the connecting wires from the source-drain layer 107 to the light shielding layer 111. Such a same-layer preparation process avoids the complex process caused by separate production of different functional structures, thereby simplifying the production process, effectively improving the working efficiency, and reducing the product production costs. Optionally, as shown in FIGS. 5B and 3B, when making the eleventh via h11, the third via h3 shown in FIG. 3B can be directly used as the eleventh via h11, as both of them are used for electrical connection from the source-drain layer 107 to the light shielding layer 111. In this way, the existing structure can be fully utilized to meet the new functional requirement, so as to avoid the separate production of the eleventh via h11 and simplify the process flow.

Figure 6:
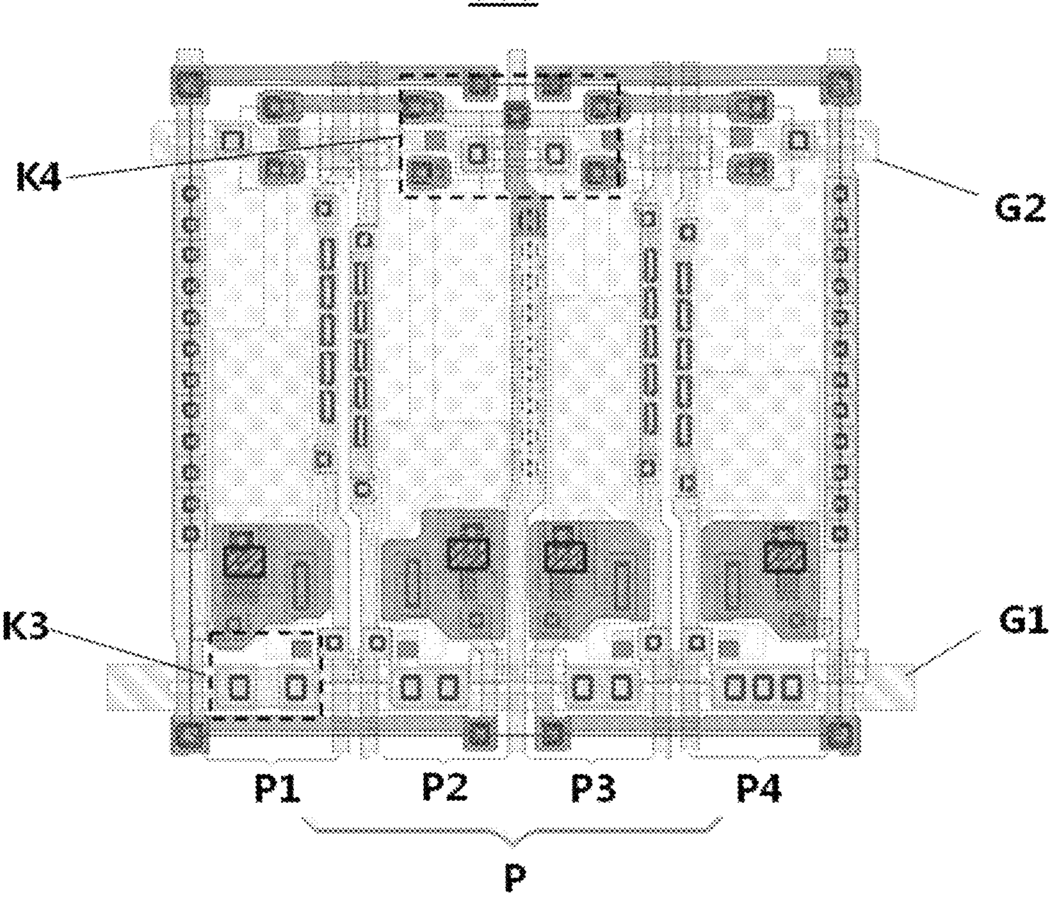
FIG. 6 shows a structural schematic diagram of an array substrate according to some embodiments of the present disclosure.

FIG. 6 shows a structural schematic diagram of an array substrate according to some embodiments of the present disclosure. As shown in FIG. 6, similar to FIG. 1, the array substrate 600 comprises a pixel unit P as well as a first gate line G1 and a second gate line G2. The pixel unit P comprises sub-pixels P1, P2, P3, P4, each sub-pixel comprising a light emitting element and a pixel circuit electrically connected to the light emitting element. Each pixel circuit comprises at least one transistor. However, unlike FIG. 1, in the pixel unit P of the array substrate 600 shown in FIG. 6, a gate line bridging manner different from FIG. 1 in position and structure is used to address the issue of transistor channel breakdown caused by electrostatic accumulation on the first gate line G1 and the second gate line G2. With respect to the electrostatic problem caused by the first gate line G1, unlike FIG. 1, which separates the connecting wires between the first gate line G1 and the gate g1 and bridges the separated connecting wires across layer (s), the array substrate shown in FIG. 6 adopts a structure of gate line separation and bridging (similar to the box K2 in FIG. 1). As shown in the dashed box K3 in FIG. 6, the first gate line G1 is separated into two sub gate lines at the corresponding position of the sub-pixel P1, and the electrical connection between these two sub gate lines is achieved through cross-layer bridging. The specific bridging manner thereof is the same as that in FIG. 4 and FIG. 5A or 5B, and will not be repeated here. On the other hand, with respect to the electrostatic problem caused by the second gate line G2, as shown in box K4 of FIG. 6, the array substrate 600 adopts a manner of directly separating and bridging the gate lines similar to K2 in FIG. 1, but the position is different from FIG. 1. As shown in FIG. 6, the separation and bridging position of the second gate line G2 of the array substrate 600 are placed between sub-pixels P2 and P3, rather than within the sub-pixel P1. Compared with FIG. 1, the bridging structure of the second gate line G2 of the array substrate 600 in FIG. 6, located between two sub-pixels, can simultaneously take into account the gates of the second transistors in two sub-pixels (such as P2 and P3), and block the electrostatic conduction from the second gate line to these two gates, thereby significantly reducing the number of bridging structures and simplifying the overall process flow of the array substrate.

In some embodiments according to the present disclosure, a display panel is further provided, which comprises an array substrate according to some embodiments of the present disclosure. The display panel shares the same technical features and working principle as the array substrate mentioned above, and will not be repeated here. This display panel can be used for various electronic devices that require display screens, such as desktop computers, smartphones, tablets, etc.

By studying the drawings, the disclosure and the appended claims, those skilled in the art can understand and realize the variations of the disclosed embodiments when practicing the claimed subject matter. In the claims, the word "comprising" does not exclude other elements or steps, and "a" or "an" does not exclude a plurality. The mere fact that certain measures are recited in mutually different dependent claims does not mean that the combination of these measures cannot be used for advantages.

In the description of this specification, the description of the terms "one embodiment", "some embodiments", "examples", "specific examples" or "some examples" means that the specific features, structures, materials or characteristics described in connection with this embodiment or example are included in at least one embodiment or example of the present disclosure. In this specification, the schematic expressions of the above terms do not necessarily refer to the same embodiment or example. Furthermore, the specific features, structures, materials or characteristics described may be combined in any one or more embodiments or examples in a suitable manner. In addition, those skilled in the art can combine different embodiments or examples and features of different embodiments or examples described in this specification without contradicting each other.

The invention claimed is:

1. An array substrate, comprising:

at least one pixel unit, each pixel unit comprising at least one sub-pixel, each sub-pixel comprising a pixel circuit, the pixel circuit comprising a first transistor; and a first gate line electrically connected to a gate of the first transistor through a first connecting part, wherein the first connecting part and the first gate line are in different conductive layers from each other, wherein the array substrate comprises a buffer layer and a light shielding layer, the buffer layer is above a base substrate of the array substrate and the light shielding layer is between the buffer layer and the base substrate, the light shielding layer comprises a light shielding pattern made of a conductive material, and the light shielding pattern is electrically connected to a source-drain of the first transistor through a third via, wherein the third via is arranged on an interlayer dielectric layer and the buffer layer, wherein the first connecting part comprises: a first connecting sub-part and a second connecting sub-part arranged in a same layer as the source-drain of the first transistor, and a third connecting sub-part arranged in a same layer as the light shielding layer, and wherein the first connecting sub-part is electrically connected to the gate of the first transistor through a fourth via, the second connecting sub-part is electrically connected to the first gate line through a fifth via, and the third connecting sub-part is electrically connected to the first connecting sub-part and the second connecting sub-part respectively through the third via, wherein the fourth via and the fifth via are arranged on the interlayer dielectric layer.

2. The array substrate according to claim 1, wherein the third via comprises a first sub-via arranged on the interlayer dielectric layer and a second sub-via arranged on the buffer layer, orthogonal projections of the first sub-via and the second sub-via on the base substrate of the array substrate at least partially overlap with each other.

3. The array substrate according to claim 1, wherein the pixel circuit further comprises a second transistor, and the array substrate further comprises:

a second gate line electrically connected to a gate of the second transistor, the second gate line comprising a first sub gate line and a second sub gate line separated from each other, the first sub gate line and the second sub gate line are electrically connected to each other through a second connecting part, wherein the second connecting part and the second gate line are in different conductive layers from each other.

4. The array substrate according to claim 3, wherein at least a portion of the second connecting part is arranged in a same layer as a source-drain of the second transistor.

5. The array substrate according to claim 4, wherein the second connecting part is electrically connected to the first sub gate line and the second sub gate line through a seventh via and an eighth via respectively, the seventh via and the eighth via are arranged on the interlayer dielectric layer.

6. The array substrate according to claim 4, wherein the second connecting part comprises: a fourth connecting sub-part and a fifth connecting sub-part arranged in the same layer as the source-drain of the second transistor, as well as a sixth connecting sub-part arranged in the same layer as the light shielding layer, and wherein the fourth connecting sub-part is electrically connected to the first sub gate line through a ninth via, the fifth connecting sub-part is electrically connected to the second sub gate line through a tenth via, the sixth connecting sub-part is electrically connected to the fourth connecting sub-part and the fifth connecting sub-part respectively through an eleventh via, the ninth via and the tenth via are arranged on the interlayer dielectric layer, and the eleventh via is arranged on the interlayer dielectric layer and the buffer layer.

7. The array substrate according to claim 6, wherein the eleventh via comprises a third sub-via arranged on the interlayer dielectric layer and a fourth sub-via arranged on the buffer layer, orthogonal projections of the third sub-via and the fourth sub-via on the base substrate of the array substrate at least partially overlap with each other.

8. The array substrate according to claim 3, wherein the first sub gate line and the second sub gate line are separated from each other between two adjacent sub-pixels in the pixel unit.

9. The array substrate according to claim 3, wherein the pixel circuit comprises a 3T1C pixel circuit, wherein at least one of the first transistor and the second transistor is a switch transistor.

10. The array substrate according to claim 3, wherein at least one of the first transistor and the second transistor is a thin film transistor.

11. A display panel comprising the array substrate according to claim 1.

* * * * *